(12) United States Patent
Limbacher et al.

(10) Patent No.: US 9,908,679 B2
(45) Date of Patent: Mar. 6, 2018

(54) HOUSING PART FOR A HOUSING WITH FLAMEPROOF ENCAPSULATION COMPRISING A POROUS BODY

(71) Applicant: R. Stahl Schaltgerate GmbH, Waldenburg (DE)

(72) Inventors: Bernd Limbacher, Schwabisch Hall (DE); Ulrich Mann, Schwabisch Hall (DE)

(73) Assignee: R. Stahl Schaltgeräte GmbH, Waldenburg (DE)

( * ) Notice: Subject to any disclaimer, the term of this patent is extended or adjusted under 35 U.S.C. 154(b) by 456 days.

(21) Appl. No.: 14/469,201

(22) Filed: Aug. 26, 2014

(65) Prior Publication Data

US 2015/0060465 A1 Mar. 5, 2015

(30) Foreign Application Priority Data

Aug. 27, 2013 (DE) .................. 10 2013 109 260

(51) Int. Cl.
*B65D 1/24* (2006.01)
*B65D 81/02* (2006.01)
(Continued)

(52) U.S. Cl.
CPC .............. *B65D 81/022* (2013.01); *A62C 4/00* (2013.01); *H02B 1/28* (2013.01); *H05K 5/0213* (2013.01); *A62C 3/002* (2013.01)

(58) Field of Classification Search
CPC .......... C08L 67/02; C08L 69/00; C08K 5/523
(Continued)

(56) References Cited

U.S. PATENT DOCUMENTS

| 3,173,451 | A | * | 3/1965 | Slayter | ................. | B22D 19/00 |
|---|---|---|---|---|---|---|
| | | | | | | 106/38.22 |
| 3,568,723 | A | * | 3/1971 | Sowards | ............... | B22D 19/00 |
| | | | | | | 138/111 |

(Continued)

FOREIGN PATENT DOCUMENTS

| CN | 1781803 A | 6/2006 |
|---|---|---|
| CN | 102985153 A | 3/2013 |
| CN | 103260710 A | 8/2013 |

OTHER PUBLICATIONS

Search Report dated Sep. 5, 2017, in Chinese Patent Application No. 201410427245.2, filed Aug. 27, 2014 (w/ English Translation).

*Primary Examiner* — Ellen S Wood
(74) *Attorney, Agent, or Firm* — Leydig, Voit & Mayer, Ltd.

(57) ABSTRACT

A housing part for an explosion-protected housing (10) with flameproof encapsulation. The housing part comprises a porous body (20) in a passage (15) of the housing part. The passage (15) is closed in a flameproof manner by means of the porous body (20). The porous body (20) comprises an inner side (21) assigned to the interior of the housing (10) and an outer side (22) assigned to the surrounding area (12) comprising the explosive atmosphere. A gas volume flow can pass through the porous body (20), entering the porous body (20) on the inner side (21) and escape on the outer side (22) or vice versa. To prevent the penetration of water or of other aqueous liquids into the interior of the housing (10), the porous body (20) comprises a hydrophobic surface (B) in at least one area (31).

13 Claims, 4 Drawing Sheets

(51) Int. Cl.
*A62C 4/00* (2006.01)
*H02B 1/28* (2006.01)
*H05K 5/02* (2006.01)
*A62C 3/00* (2006.01)

(58) Field of Classification Search
USPC .................................................. 524/147, 414
See application file for complete search history.

(56) References Cited

U.S. PATENT DOCUMENTS

| | | | |
|---|---|---|---|
| 4,013,190 A * | 3/1977 | Wiggins | A62C 4/00 220/501 |
| 2005/0282062 A1* | 12/2005 | Manako | H01M 4/8605 429/450 |

* cited by examiner

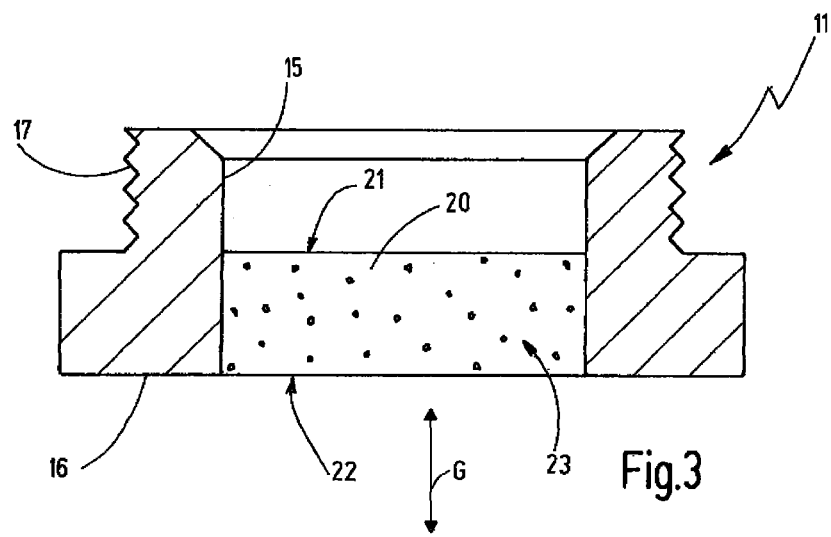
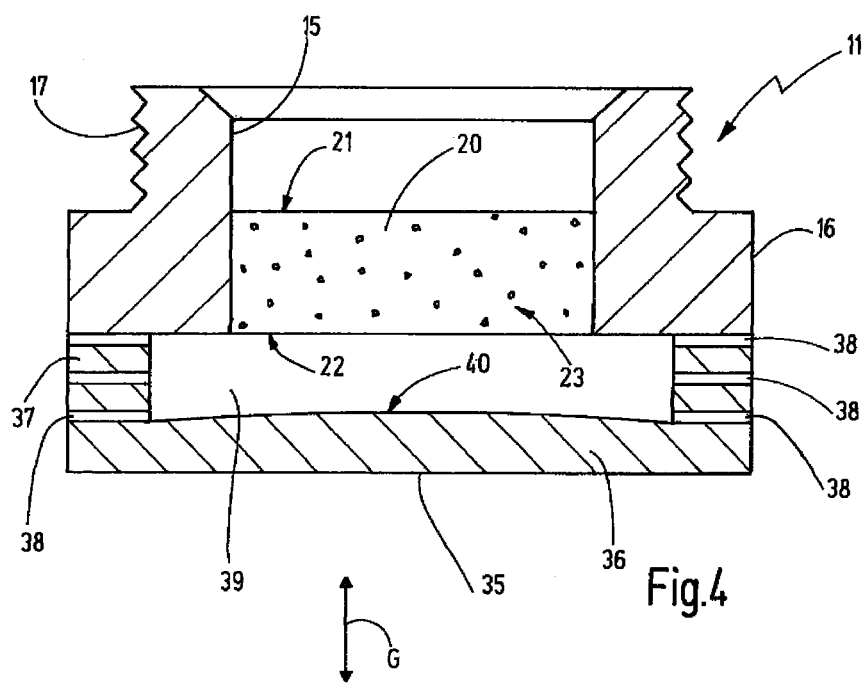

HOUSING PART FOR A HOUSING WITH FLAMEPROOF ENCAPSULATION COMPRISING A POROUS BODY

FIELD OF THE INVENTION

The invention relates to a housing part for an explosion-protected housing of the flameproof encapsulation type. For example, a housing wall, a housing wall section or a nozzle, which can be connected to a housing wall, can serve as housing part. The explosion-protected housing preferably is embodied in an ignition protection type "flameproof encapsulation" (Ex-d). Typically, electrical and/or electronic component parts or components which can represent ignition sources for an explosive atmosphere present in the surrounding area outside of the housing are located in the explosion-protected housing. The explosion-protected housing with flameproof encapsulation separates such ignition sources from the explosive atmosphere.

BACKGROUND OF THE INVENTION

The housing or the housing part typically comprises a porous body which serves as a flow-through device for providing a gas exchange connection between the interior of the housing and the surrounding area. This connection can serve the purpose of balancing the pressure difference between the interior of the housing and the surrounding area, which appears due to temperature changes, e.g. Additionally or in the alternative, the gas exchange connection through the gas-permeable porous body ensures that the pressure on the housing is limited in the event of an explosion, which takes place within the housing. The porous body thereby represents a gas-permeable barrier, which does not allow for flames and sparks or the like to escape out of the interior of the container to the outside. The porous body is thus embodied so as to be free from spark gaps and thus in a flameproof manner. Due to the fact that in the event of an explosion the gas volume can expand through the porous body to the outside into the surrounding area of the housing, the explosion pressure on the housing is limited so that the latter withstands the explosion and does not form any tears or gaps through which the flames or sparks could reach out of the interior of the housing to the outside A housing part comprising a porous body for forming a pressure release device is known from U.S. Pat. No. 4,180,177 A. The porous body is inserted in a passage in the housing wall. To avoid water penetration into the housing, the porous body is covered by a flap. This flap opens, as soon as a sufficiently large overpressure appears in the interior of the housing. It is disadvantageous thereby that a certain overpressure must initially appear within the housing before the flap opens at all. Smaller pressure differences cannot be compensated continuously. The functional capability of the flap must be ensured and must be checked on a regular basis.

DE 10 2010 016 782 A1 describes a pressure release device comprising a nozzle having a passage in which a porous body is arranged. The passage in the nozzle can furthermore be covered completely by a membrane so as to prevent water from penetrating through the porous body into the housing. However, the membrane limits the volume or mass flow, respectively, through the porous body.

The use of an air-permeable membrane in the case of an air filter is proposed in EP 2 404 652 A1. However, the design described therein is not suitable for explosion-proof applications.

A ventilation and dewatering nozzle for a housing is known from DE 43 13 776 C1. A labyrinth arrangement, by means of which an air exchange is made possible, is present therein. Water can be discharged from the interior of the housing by means of the labyrinth arrangement, but the penetration of water into the interior of the housing is avoided.

U.S. Pat. No. 3,987,258 describes a splash water protective cover for a radio. However, an explosion protection is also not ensured.

OBJECTS AND SUMMARY OF THE INVENTION

It is an object of the present invention to provide a housing part for an explosion-protected housing with flameproof encapsulation which ensures a high gas volume flow and which nonetheless avoids the penetration of water into the housing in a simple manner.

A housing part according to the invention comprises a porous body arranged in a passage of the housing part. For example, a housing wall, a housing wall section or a nozzle having a passage can serve as the housing part. The porous body is arranged in the passage in a non-positive and/or firmly bonded and/or positive manner without a spark gap remaining between the wall, which defines the passage, and the porous body. An inner side of the porous body is assigned to the interior of the housing. The opposite outer side of the porous body is assigned to the surrounding area of the housing. Gas can penetrate into the porous body on the inner side and escape on the outer side of the porous body. An opposite gas flow is also possible.

The porous body comprises a hydrophobic surface. The hydrophobic surface can be formed by means of a surface treatment and/or coating and/or activation of the surface. A surface activation, for example, can be attained by means of laser interference structuring or nanostructures. The hydrophobic surface is present in at least one area of the porous body. It prevents water from being able to penetrate into the interior of the housing from the surrounding area. In a preferred exemplary embodiment, a coating or layer of the porous body, which forms the outer side, can comprise the hydrophobic surface.

Accordingly, a water-repellent membrane at the passage can be foregone. The gas volume flow through the porous body is thus possible in an unhindered manner. The hydrophobic surface does not noticeably impact the gas volume flow. A pressure compensation can thus also take place in an unhindered manner in the case of smaller pressure differences. In addition, the design and assembly of the housing part is simplified. In the event of an explosion in the interior of the housing, the housing part can also limit the housing pressure as a pressure release device. Due to the pressure release, the housing itself can be constructed to be less stable than without such a pressure release. In the case of a sudden pressure rise during an explosion, an unhindered large gas volume flow through the porous body is ensured.

The hydrophobic surface, which is formed by means of a coating, for example, is present in particular in the area of the outer side of the porous body. In the event of an explosion, the gas temperature on the outer side is lower so that the hydrophobic surface is not impacted or is impacted less strongly by the hot explosion gases which stream into the porous body on the inner side. As an alternative, the hydrophobic surface can also be present in the area of the inner side of the porous body or on the inner side as well as on the outer side. It is furthermore possible to provide the entire porous body with a hydrophobic surface. In each of the exemplary embodiments, it is sufficient if the hydrophobic surface is present in the surface area of the porous body. The inner core of the porous body can, but does not need do comprise a hydrophobic surface.

The hydrophobic surface can contain a fluorocarbon and/or a silane. A fluorocarbon and/or silane has the advantage that in addition to its hydrophobic effect, it also protects against the penetration of oily liquids into the interior of the housing. In addition, the adhesion of dirt particles to the porous body is reduced, so that an impacting of the gas volume flow by a clogging of pores can be avoided or can at least reduced. For example, polytetrafluoroethylene can be used as material for the hydrophobic surface. In addition or in the alternative, the hydrophobic surface can also contain fats and/or waxes. The porosity and/or the pore size of the pores of the porous body can be smaller in the area of the hydrophobic surface than outside of the area comprising the hydrophobic surface.

In the case of a preferred exemplary embodiment, the porous body is formed by means of a randomly oriented fiber structure part. The porous body comprises fibers, which are intertwined and which are arranged in an unordered manner, which form the randomly oriented fiber structure part. Preferably, the fibers have a diameter of at least 70 micrometers and of maximally 130 micrometers. Preferably, all of the fibers or at least a part of the fibers of the porous body can be provided with the hydrophobic surface. It is possible to thereby provide the fibers with the hydrophobic surface prior to the intertwining and thus prior to forming the randomly oriented fiber structure part. As an alternative, the fibers or at least a part of the fibers can be provided with the hydrophobic surface after the formation of the randomly oriented fiber structure part.

It is advantageous if the pore size of the porous body is at least 80 micrometers and maximally 250 micrometers. The porosity of the porous body can be at least 60% and maximally 80%. This pore size and/or this porosity ensures a high gas volume flow and simultaneously effects a sufficient mechanical stability of the porous body. Between the inner side and the outer side, the porous body can comprise a thickness of at least 5 and 10 mm.

The porous body and preferably the fibers of the porous body are made of a temperature-resistant material. Preferably, the material is temperature-resistant up to at least 400° C. For example, the porous body or the fibers of the porous body, respectively, can be made of an alloyed steel, in particular of a chromium alloyed steel, for example stainless steel.

In a preferred exemplary embodiment, the porous body is located in a passage directly in the housing wall or in a housing wall section of the housing. As an alternative to this, a housing wall section, a housing wall or all of the housing walls of a housing can be formed from a porous body.

In another exemplary embodiment, the porous body can be inserted in a passage of a nozzle. The nozzle can be part of a pressure release device or of a breather.

The porous body can be connected to the wall of the housing part which defines the passage in a non-positive manner, for example by means of an interference fit and/or in a firmly bonded manner. For example, it is also possible to mold the porous body into a housing wall or a housing wall section, for example in that the porous body is inserted in a casting mold and is insert molded or recast, respectively, with the material of the housing wall or of the housing wall section, respectively.

To prevent the penetration of splash water, which hits the porous body at a high speed, into the interior of the housing, a splash water protection, preferably a splash water protective cover, can be present in the area of the outer side of the porous body in the housing part. The porous body can thus be protected from splash water which is directed to the housing part at a high pressure.

Other objects and advantages of the invention will become apparent upon reading the following detailed description and upon reference to the drawings, in which:

BRIEF DESCRIPTION OF THE DRAWINGS

FIG. 3 is a is an enlarged vertical section of a pressure release device for the explosion-protected housing shown in FIG. 1;

FIG. 4 is an enlarged vertical section of an alternative embodiment of pressure release device according to the invention;

Figure 1:
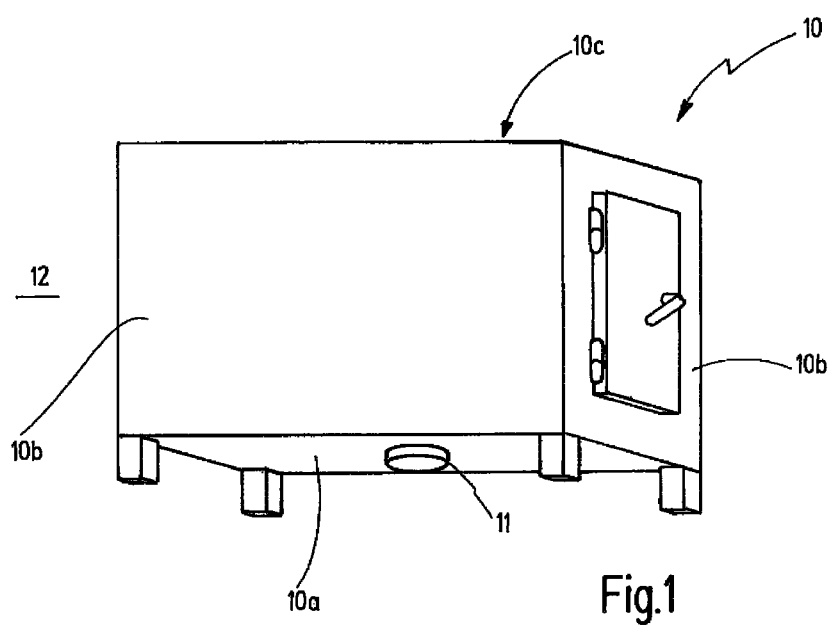
FIG. 1 is a perspective of an illustrative explosion-protected housing with flame-protection encapsulation in accordance with the invention.

While the invention is susceptible of various modifications and alternative constructions, certain illustrative embodiments thereof have been shown in the drawings and will be described below in detail. It should be understood, however, that there is no intention to limit the invention to the specific forms disclosed, but on the contrary, the intention is to cover all modifications, alternative constructions, and equivalents falling within the spirit and scope of the invention.

DETAILED DESCRIPTION OF THE PREFERRED EMBODIMENTS

Referring now more particularly to FIG. 1 of the drawings, there is shown an illustrative explosion-protect housing with flameproof encapsulation 10 in accordance with the invention. The explosion-protect housing with flameproof encapsulation 10 in particular provides an ignition protection type "pressure-resistant encapsulation" (Ex-d). It comprises a flow-through device 11 in a housing bottom 10a, a housing wall 10b, or a housing top 10c of the housing 10. Exemplary embodiments for the flow-through device 11 are illustrated in FIGS. 3 and 4.

The flow-through device 11 serves as pressure release device and/or as pressure compensating device. In its function as pressure compensating device, pressure differences between the interior of the housing 10 and the surrounding area 12 outside of the housing 10 are compensated, in that a gas volume can flow through the flow-through device 11 from the interior into the surrounding area 12 or vice versa. Such pressure differences can result because of pressure fluctuations, for example, in particular if the solar radiation acts on the explosion-protected housing 10 with flameproof encapsulation.

In the ignition protection type "pressure-resistant encapsulation", the explosion-protected housing with flameproof encapsulation must be able to withstand an explosion pressure in the interior of the housing 10. The flow-through device 11 serves as pressure release device for limiting the explosion pressure in the interior of the housing 10. For this purpose, a sufficiently large volume flow through the flow-through device 11 is ensured if the pressure in the interior of the housing 10 rises in response to an explosion. Due to the pressure limitation by means of the flow-through device 11, the housing 10 can be constructed less stable in response to expected explosion pressures, whereby material, costs and weight can be saved.

The flow-through device 11 comprises a passage 15 which connects the interior of the housing 10 to the surrounding area 12 and which provides for a gas flow. The cross section of the passage 15 can be designed in an arbitrary manner. In the case of the exemplary embodiments illustrated herein, the passage 15 has a circular cross section.

According to the exemplary embodiment, the passage 15 penetrates a nozzle 16. The nozzle 16 can be fastened in an opening of the housing 10 in the housing bottom 10a, in a housing wall 10b or in the housing top 10c. In this case, the nozzle 16 has an external thread 17 by means of which the nozzle 16 can be screwed into an internal thread in the opening of the respective housing part. The nozzle 16 can also be arranged and fixed in a non-positive manner and/or in a positive manner and/or in a firmly bonded manner in the opening of the housing 10 or any other manner.

Electrical and/or electronic components, which are not illustrated, are arranged in the housing 10 in a conventional manner. Such components can serve as ignition sources for an explosive atmosphere in the surrounding area 12 of the housing 10. The passage 15 of the flow-through device 11 thus may not have a spark gap. A porous body 20 is thus inserted in the passage 15. Due to its porosity, the porous body 20 allows for a gas flow through the porous body 20, but ensures simultaneously that flames or spark gaps cannot reach through the passage 15 out of the interior of the housing 10 into the surrounding area 12.

The porous body 20 can be fastened in the passage 15 in a firmly bonded manner and/or in a non-positive manner and/or in a positive manner. For example, it is advantageous, if the porous body 20 is placed into a casting mold during production of the nozzle 16 and establishes a firmly bonded connection to the nozzle 16 when material is filled into the casting mold. As an alternative to this, the porous body 20 can be held in the passage 15 by means of an interference fit, wherein an elastic clamping force is created between the wall of the nozzle 16 which defines the passage 15 and the porous body 20. In this embodiment, the porous body 20 can additionally be secured against being displaced or pushed out of the passage 15, respectively, by means of securing means in the direction of extension of the passage 15.

In the exemplary embodiment, the porous body 20 has the shape of a disc. It comprises an inner side 21, which is assigned to the interior of the housing 10, and an outer side 22, which is assigned to the surrounding area 12 outside of the housing 10. For example, gas can enter into the porous body 20 on the inner side 21, and can escape on the outer side 22 or also vice versa. The inner side 21 and the outer side 22 are connected to one another via a peripheral surface 23. The peripheral surface 23 is closed in a ring-shaped manner. In top view onto the inner side 21 or the outer side 22, the porous body 20 has a contour or shape, which is adapted to the contour or shape of the cross sectional surface of the passage 15 such that a spark gap-free connection between the wall, which defines the porous body 20 and the wall, which defines the passage 15, is possible. In the exemplary embodiment, the porous body 20 has a circular contour.

Figure 7:
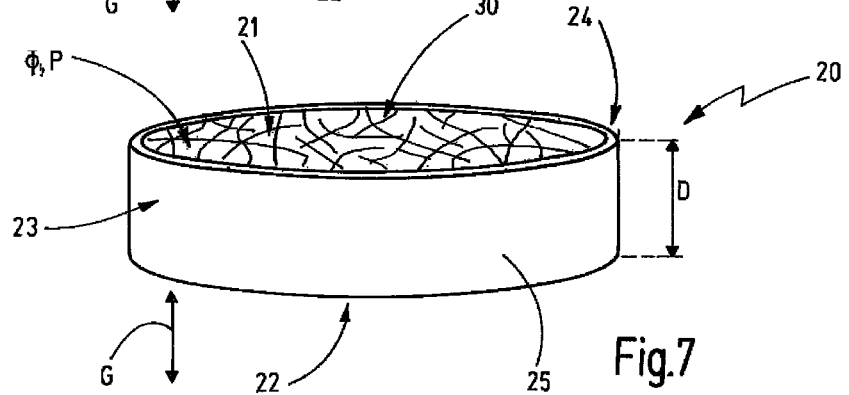

Preferably, the porous body comprises fibers 29 which are intertwined with one another in an unordered manner. The porous body 20 thus comprises a randomly oriented fiber structure part (FIG. 7) or is formed by such a randomly oriented fiber structure part 30.

The fibers preferably consist of metal and, in the case of the exemplary embodiment, of a chromium alloyed steel or stainless steel. Preferably, all of the fibers 29 have the same diameter. The diameter is at least 70 micrometers and maximally 130 micrometers.

Figure 5:
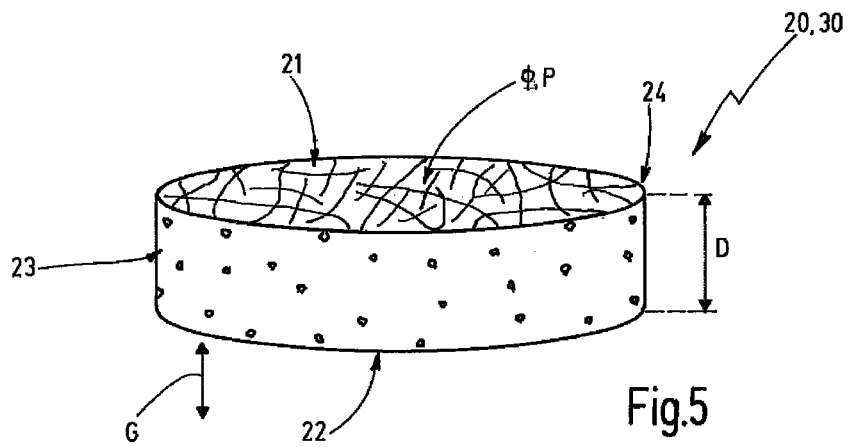
FIGS. 5-7 are perspectives of alternative exemplary embodiments of porous bodies for use in an explosion-protected housing in accordance with the invention.
Figure 6:
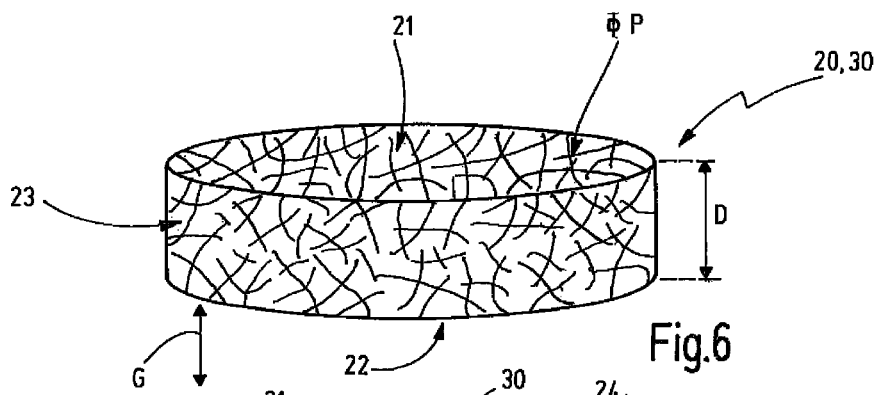

The porosity Φ of the porous body 20 can be calculated as follows:

$$\Phi = \left(1 - \frac{\rho}{\rho_0}\right) \cdot 100\%,$$

with
Φ: porosity in percent
$\rho$: molded density of the body
$\rho_0$: true density of the body
In the exemplary embodiment of the porous body 20 illustrated in FIG. 6, the porosity Φ is substantially constant across the entire porous body 20. In contrast, the porosity Φ is smaller in an edge area 24, which comprises the peripheral surface 23, in the exemplary embodiments according to FIGS. 5 and 6. In addition to its porous material, the porous body 20 also comprises a ring part 25, which surrounds the porous material or the randomly oriented fiber structure part 30 in a ring-shaped manner and which thus forms a peripheral surface 23 of the porous body 20, which is substantially closed in a gas-tight manner, in the embodiment illustrated in FIG. 7. A gas penetration or a gas escape, respectively, is only possible on the inner side 21 or on the outer side 22, respectively.

Figure 9:
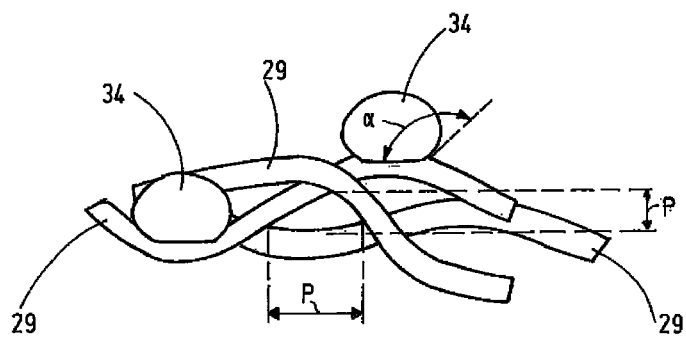
FIG. 9 is a schematic illustration of the mode of operation of a hydrophobic surface of the porous body according to the exemplary embodiments.

The porosity Φ of the porous body 20 or of the randomly oriented fiber structure part 30, respectively, is at least 60% and maximally 80%. The pore size P of the porous body 20 or of the randomly oriented fiber structure part 30, respectively, lies at least in one spatial direction and preferably in at least two spatial directions in a range of at least 80 micrometers to maximally 250 micrometers. In particular, the pore size P in the two spatial directions lies within the specified range, in which the inner side 21 and the outer side 22 extend at a right angle to the gas flow direction G. The pore size P is illustrated schematically in FIG. 9.

The thickness D of the porous body 20 between the inner side 21 and the outer side 22 is at least 5 to 10 mm.

Figure 8:
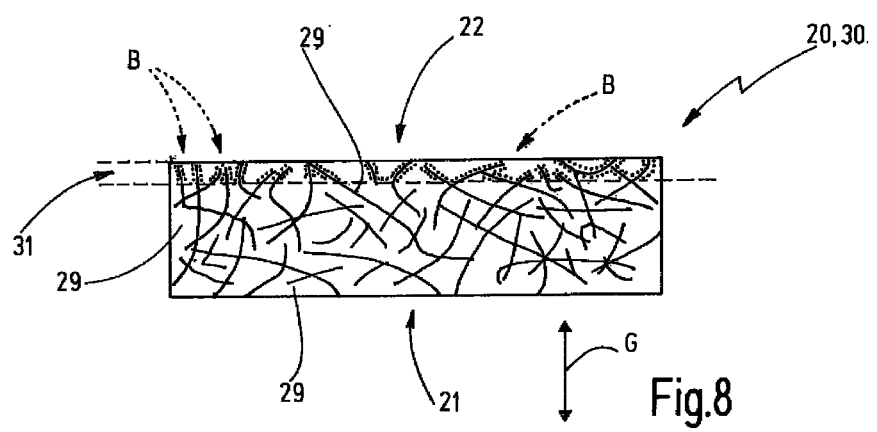
FIG. 8 is a cross section of a porous body, such as shown in FIGS. 5-7.

The porous body 20 or the randomly oriented fiber structure part 30, respectively, comprises a hydrophobic surface B. This hydrophobic surface B is illustrated in FIG. 8 in a highly schematic manner and is formed there by means of a coating, for example. As an alternative, the hydrophobic surface can be created by activating and/or treating the material of the porous body 20 or of the randomly oriented fiber structure part 30, respectively. For example, an activation of the hydrophobic characteristics is possible by means of a laser interference structuring or by creating nanostructures.

The hydrophobic surface B is attached directly at the randomly oriented fiber structure part 30 or the porous body 20, respectively. In the exemplary embodiment, the fibers 29 are provided with the hydrophobic surface B at least in one area 31 of the porous body 20 or of the randomly oriented fiber structure part 30. According to the example, this area 31 contains at least the outer side 22. In the alternative or additionally, the area 31 could also contain the inner side 21 and could adjoin it. It further is possible to provide a plurality of areas 31 or the entire porous body 20 or the entire randomly oriented fiber structure part 30, respectively, with a hydrophobic surface B. For example, the fibers 29 can be provided with the hydrophobic surface B prior to the intertwining to form the randomly oriented fiber structure part 30. Preferably, the hydrophobic surface B, however, is first applied as coating to the porous body 20 or the randomly oriented fiber structure part 30 in at least one area 31 or is created at the porous body 20 or the randomly oriented fiber structure part 30.

As is illustrated in FIG. 8, at least one layer of the randomly oriented fiber structure part 30 or of the porous body 20, respectively, which contains the outer side 22 and which adjoins this outer side 22, is provided with the hydrophobic surface B. This has the advantage that in the event of an explosion in the interior of the housing 10, the hot gases, which permeate on the inner side 21, are cooled down initially, until they reach the area 31 comprising the hydrophobic surface B. The hydrophobic surface B or the coating can thus be less temperature-resistant than the material which is used to produce the porous body 20.

Preferably, the material, which is used to produce the porous body 20 or the randomly oriented fiber structure part 30 according to the example the fibers 29 have a temperature resistance of at least 400° C. In the exemplary embodiment, the material, which is used for the hydrophobic surface B, which is formed by means of a coating, contains a fluorocarbon. For example, the surface B can contain polytetrafluoroethylene or can be formed from it. Other materials comprising a fluorocarbon and/or one or a plurality of silanes can also be used. The fluorocarbons and/or silanes have the advantage that they not only prevent the penetration of water through the porous body 20 into the interior of the housing 10, but also impede or hinder the penetration of oily fluids. Fluorocarbons furthermore impede the adhesion of particles to the porous body 20, so that the pores do not clog with dirt particles and impede or reduce the gas volume flow through the porous body 20. As an alternative or in addition to a fluorocarbon and/or a silane, the material of the hydrophobic surface B can also contain a fat and/or a wax.

In the area 31 comprising the hydrophobic surface B, the porosity Φ or the pore size P, respectively, can be smaller than outside of this area 31. Preferably, the porosity Φ and/or the pore size P is nonetheless within the respective above-specified range, that is, the pore size P is at least 80 micrometers and maximally 150 micrometers and/or the porosity Φ is at least 60% and maximally 80%.

The contact angle α between a drop of water 34 and the surface on the outer side 22 of the porous body 20 or of the randomly oriented fiber structure part 30 is increased by means of the hydrophobic surface B and is larger than 90°, and preferably larger than 120°, and more preferably larger than 160°. It is attained through this that smaller drops of water, which are smaller than the pore size P, combine to form larger drops of water 34 and cannot pass through the pores into the interior of the housing 10. The area 31 comprising the hydrophobic surface B is thus not permeated by drops of water. It is irrelevant thereby, whether the area 31 is present directly on the outer side 22 or at a different section of the porous body 20 or of the randomly oriented fiber structure part 30.

In the exemplary embodiment according to FIG. 4, the flow-through device 11 comprises a protective cover 35 on the side which is assigned to the surrounding area 12. The protective cover 35 is arranged at a distance to the outer side 22 of the porous body 20 and in this case is connected to the nozzle 16. The protective cover 35 comprises a closed protective wall area 36 which is arranged at a distance to the outer side 22 and which completely covers the outer side 22. The protective wall section 36 is connected to the nozzle 16 by means of at least one holding element 37. The at least one holding element 37 extends away from the nozzle 16 and thus holds the protective wall section 36 at a distance from the outer side 22 of the porous body 20 and a distance to the opening of the passage 15. In the exemplary embodiment, a single holding element 37, which is ring-shaped, is provided, which surrounds the outlet of the passage 15 on the side of the nozzle 16, which is assigned to the surrounding area 12. As a modification for this, provision could also be made for a plurality of individual holding elements 37, which are distributed around the periphery.

The holding element 37, which, according to the example, is closed in a ring-shaped manner, comprises a plurality of discharge channels 38, which are located about the periphery. Water, which accumulates in a space 39 between the protective wall section 36 and the porous body 20, can drain from the intermediate space 39 through these discharge channels 38. The protective wall section 36 protects the porous body 20 or the outer side 22 thereof from splash water or a water jet hitting the porous body 20 directly. The protective cover 35 thus forms a jet and splash water protection.

In the exemplary embodiment illustrated herein, the inner surface 40 of the protective wall section 36, which faces the intermediate space 39, does not extend in a plane, but rather has a convex shape. An incline is formed through this so that water, which collects in the space 39 on the inner surface 40, flows in the direction of the discharge channels 38. This is advantageous when the flow-through device 11 is attached to a housing bottom 10a, as is illustrated schematically in FIG. 1.

Figure 2:
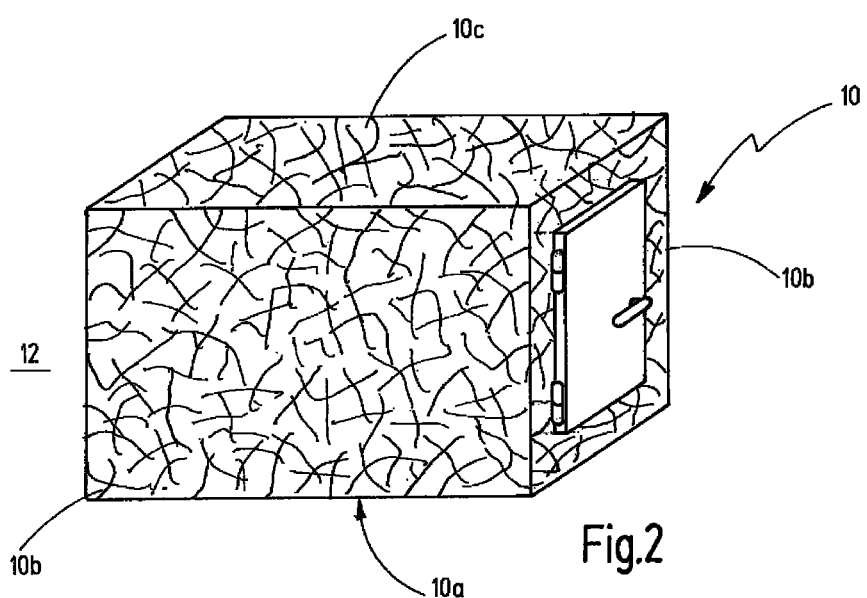
FIG. 2 is a perspective of an alternative embodiment of an explosion-proof housing according to the invention.

In the exemplary embodiments according to FIGS. 1, 2 and 3, the passage 15 is arranged in a housing part, which is formed by the nozzle 16. As an alternative to this, it is also possible to provide the passage 15 directly in a housing wall 10b, a housing bottom 10a or a housing top 10c and to arrange the porous body 20 directly at that location. In such case, the nozzle 16 is not necessary.

It is furthermore possible to embody entire housing parts, for example housing walls 10b, housing tops 10c or housing bottoms 10b from the porous body 20, which is illustrated in FIG. 2. A housing door or a cover could also be formed by a porous body 10 as an alternative to this illustration. A gas communication between the interior of the housing 10 and the surrounding area 12 is thereby possible by means of all of the housing parts 10a, 10b, 10c, which are formed by a porous body 20.

In the case of all of the embodiments, at least one area 31 of each porous body 20 is provided with the hydrophobic surface B.

From the foregoing, a housing part is provided for an explosion-protected housing 10 with flameproof encapsulation. The housing part can be formed by a nozzle 16 of a flow-through device 11 and/or by a housing wall 10b and/or by a housing bottom 10a and/or by a housing top 10c. This housing part comprises a porous body 20, which sits in a passage 15 of the housing part. The passage 15 is closed by means of the porous body 20 in a flameproof manner. The porous body 20 comprises an inner side 21, which is assigned to the interior of the housing 10 and an outer side 22 which is assigned to the surrounding area 12 comprising the explosive atmosphere. A gas volume flow can flow through the porous body 20. Gas can enter into the porous body 20 on the inner side 21 and can escape on the outer side 22 or vice versa. To prevent the penetration of water or of other aqueous liquids into the interior of the housing 10, the porous body 20 comprises a hydrophobic surface B in at least one area 31.

LIST OF REFERENCE NUMERALS 10 housing
10a housing bottom
10b housing wall
10c housing top
11 flow-through device
12 surrounding area
15 passage
16 nozzle
17 external thread
20 porous body
21 inner side
22 outer side
23 peripheral surface
24 edge area
25 ring part
29 Fiber
30 randomly oriented fiber structure part
31 Area
34 drop of water
35 protective cover
36 protective wall section
37 holding element
38 discharge channel
39 space
α contact angle
p porosity
d thickness
b hydrophobic surface
g gas flow direction
p pore size

The invention claimed is:

1. An explosion-protected housing (10) with flameproof encapsulation comprising:
a housing part (16),
said housing part having a passage (15) into which a flameproof porous body (20) is inserted for defining a pressure release device to limit an explosion pressure in an interior of the housing (10),
said porous body (20) having an inner side (21) assigned to an interior of said housing (10) and an outer side (22) assigned to a surrounding area (12) of the housing (10),
said porous body (20) being made of an alloyed steel which is temperature resistant up to at least 400° C.
said porous body (20) having hydrophobic coating that forms a hydrophobic surface (B) for preventing the passage of water from the surrounding area and into the interior of said housing, and
said porous body (20) providing a gas-permeable connection between said inner side (21) and outer side (22) for permitting the passage of high pressure gas from the interior of said housing, through porous body (20) and hydrophobic coating and to the surrounding area (12) in the event of an explosion within the housing while preventing the passage of sparks and flames.

2. The explosion-protected housing (10) according to claim 1 in which said hydrophobic surface (B) contains or adjoins the outer side (22) of the porous body (20).

3. The explosion-protected housing (10) according to claim 1 in which said hydrophobic surface (B) contains or adjoins the inner side (21) of the porous body (20).

4. The explosion-protected housing (10) according to claim 1 in which said hydrophobic surface is formed by a hydrophobic coating (B) which contains a fluorocarbon and/or a silane.

5. The explosion-protected housing (10) according to claim 1 in which said hydrophobic surface is formed by a hydrophobic coating (B) which contains a fat and/or a wax.

6. The explosion-protected housing (10) according to claim 1 in which said porous body (20) comprises fibers which have a diameter of at least 70 micrometers and maximally 130 micrometers.

7. The explosion-protected housing (10) according to claim 6 in which said fibers (29) of the porous body (20) have a hydrophobic surface (B).

8. The explosion-protected housing (10) according to claim 1 in which said porous body (20) defines pores having a pore size (P) of at least 80 micrometers and maximally 250 micrometers.

9. The explosion-protected housing (10) according to claim 1 in which said porous body (20) has a porosity ($\Phi$) of at least 60% and maximally 80%.

10. The explosion-protected housing (10) according to claim 1 in which said porous body (20) is made of stainless steel.

11. The explosion-protected housing (10) according to claim 1 in which said porous body (20) is disposed in a passage (15) of a nozzle (16).

12. The explosion-protected housing (10) according to claim 11 in which said nozzle (16) has a splash water protector (35) at the outer side (22) of the porous body (20).

13. The explosion-protected housing (10) according to claim 1 in which said porous body has a transverse thickness of at least 5 millimeters.

* * * * *